United States Patent [19]
Lee

[11] Patent Number: 5,677,213
[45] Date of Patent: Oct. 14, 1997

[54] METHOD FOR FORMING A SEMICONDUCTOR DEVICE HAVING A SHALLOW JUNCTION AND A LOW SHEET RESISTANCE

[75] Inventor: Kil Ho Lee, Ichonkun, Rep. of Korea

[73] Assignee: Hyundai Electronics Industries Co., Ltd., Rep. of Korea

[21] Appl. No.: 604,909

[22] Filed: Feb. 22, 1996

[30] Foreign Application Priority Data

Feb. 24, 1995 [KR] Rep. of Korea ............... 1995-3738

[51] Int. Cl.$^6$ ............................................. H01L 21/266
[52] U.S. Cl. ........................... 437/41; 20/200; 20/950; 20/46
[58] Field of Search .................. 437/415 M, 20, 437/46, 950, 200, 27, 37, 191, 162, 247; 148/DIG. 3, DIG. 144

[56] References Cited

U.S. PATENT DOCUMENTS

| 5,227,329 | 7/1993 | Kobayashi et al. | 437/950 |
|---|---|---|---|
| 5,393,687 | 2/1995 | Liang | 437/46 |
| 5,439,831 | 8/1995 | Schwalke et al. | 427/24 |
| 5,536,676 | 7/1996 | Cheng et al. | 437/62 |
| 5,585,295 | 12/1996 | Wu | 437/46 |

FOREIGN PATENT DOCUMENTS

| 0526043 | 2/1993 | European Pat. Off. | 437/950 |
|---|---|---|---|
| 61-208829 | 9/1986 | Japan | 437/162 |
| 3-104214 | 5/1991 | Japan | 437/950 |
| 4-15917A | 1/1992 | Japan . | |
| 4-354328 | 12/1992 | Japan | 437/950 |
| 6-163576 | 6/1994 | Japan | 437/950 |

Primary Examiner—John Niebling
Assistant Examiner—S. Mulpuri
Attorney, Agent, or Firm—Blakely Sokoloff Taylor & Zafman

[57] ABSTRACT

In accordance with an aspect of the present invention, there is provided a method for forming a junction of a low sheet resistance on a silicon substrate, comprising the steps of forming an amorphous silicon layer on said silicon substrate; implanting impurity ions into said amorphous silicon layer; implanting transition metal ions into said amorphous silicon layer; and thermally treating said amorphous silicon layer and silicon substrate such that said transition metal ions diffuse to the surface of said silicon substrate and said impurity ions diffuse into said silicon substrate.

4 Claims, 2 Drawing Sheets

METHOD FOR FORMING A SEMICONDUCTOR DEVICE HAVING A SHALLOW JUNCTION AND A LOW SHEET RESISTANCE

BACKGROUND OF THE INVENTION

1. Field of the Invention

The present invention relates to a method for forming a semiconductor device having a shallow junction and a low sheet resistance, and more particularly to a method for fabricating a MOSFET capable of preventing a junction breakdown and an increase in the junction leakage current.

2. Description of the Prior Art

Generally, a junction in a MOS transistor is commonly formed between a silicon substrate and an active region such as source/drain regions.

In a conventional MOSFET, a titanium silicide layer is commonly used to form a device having a low sheet resistance. After implanting impurity ions into the silicon substrate, the junction is formed therein by the first thermal treatment. Next, a titanium layer is formed on the ion implantation area and the titanium silicide layer is formed by the second thermal treatment.

However, impurity ions, which are doped into the substrate, are re-diffused into the titanium silicide layer at the time of processing the second thermal treatment, and then impurity concentration at the interface of titanium silicide layer and silicon substrate is extremely reduced, resulting in schottky junction. Thus, there are some problems in the decrease in the junction breakdown voltage and the increase in the junction leakage current.

Furthermore, since the junction depth becomes shallower with the higher integration of the semiconductor devices, the sheet resistance increases making it more difficult to develop high speed devices.

SUMMARY OF THE INVENTION

An object of the present invention is to provide a method for forming semiconductor devices having simultaneously a shallow junction and a low sheet resistance without the consumption of the silicon layer.

In accordance with an aspect of the present invention, there is provided a method for forming a junction of a low sheet resistance on a silicon substrate, comprising the steps of forming an amorphous silicon layer on said silicon substrate; implanting impurity ions into said amorphous silicon layer; implanting transition metal ions into said amorphous silicon layer; and thermally treating said amorphous silicon layer and silicon substrate such that said transition metal ions diffuse to the surface of said silicon substrate and said impurity ions diffuse into said silicon substrate.

BRIEF DESCRIPTION OF THE DRAWINGS

Other objects and aspects of the invention will become apparent from the following description of embodiments with reference to the accompanying drawings, in which.

DETAILED DESCRIPTION OF THE PREFERRED EMBODIMENTS

Referring to FIGS. 1A to 1D, an embodiment of the present invention will be described below in detail.

Figure 1A:
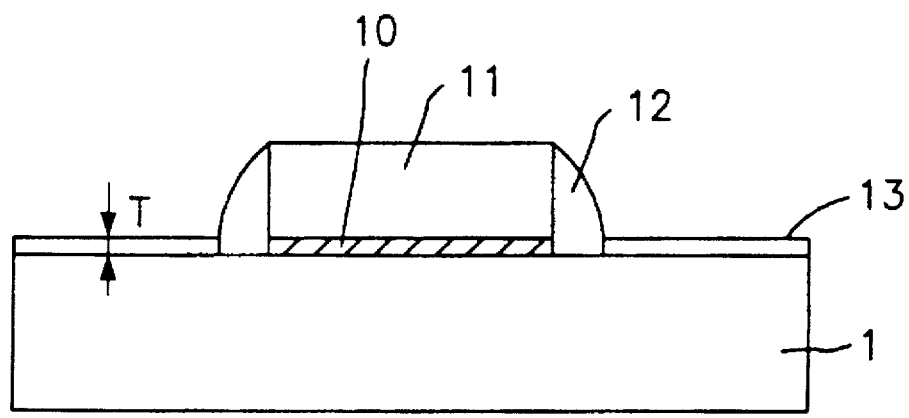
FIGS. 1A to 1D are cross-sectional views illustrating a method for forming a MOSFET in accordance with an embodiment of the present invention.

First, as shown in FIG. 1A, there are a gate oxide layer 10, a gate electrode 11, and a sidewall oxide layer 12 to form a universal MOSFET on a silicon substrate 1, and they are well-known to a person having ordinary skill in the art to which the subject matter pertains. Before forming the sidewall oxide layer 12, impurity ions can be implanted into the silicon substrate 1 to form the LDD (Lightly Doped Drain) structure, using the sidewall oxide layer 12 and an insulating layer (not shown) on the gate electrode 11 as a implanting barrier layer. An amorphous silicon layer 13 is deposited in a thickness of "T" i.e. 200–300 Å, on the exposed silicon substrate 1 in which the source/drain regions are formed.

Figure 1B:
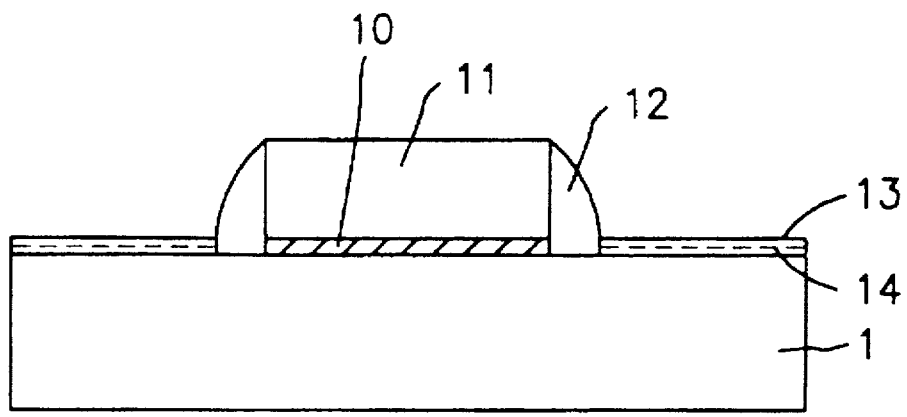

Next, as shown in FIG. 1B, boron ions 14 are positioned by implanting $BF_2$ ions into the amorphous silicon layer 13. In the case where the boron ions 14 are implanted into the silicon substrate 1, the channeling of the boron ions 14 is severely generated because of small size of boron ions. Accordingly, it is very difficult to form the shallow junction when the boron ions 14 are implanted into the silicon substrate 1. Referring again to FIG. 1A, the amorphous silicon layer 13 has an effect on the shallow junction, by preventing the boron ions 14 from penetrating into the silicon substrate 1 by means of the channeling thereof. Also, the energy of the boron ions 14 to-be-accelerated must be controlled lest they should penetrate into the interface of the silicon substrate 1 and the amorphous silicon layer 13. In a preferred embodiment, the projected range of the boron ions 14 is set at half the thickness of the amorphous silicon layer 13, i.e., the projected depth of the boron ions 14 is 0.5T.

Figure 1C:
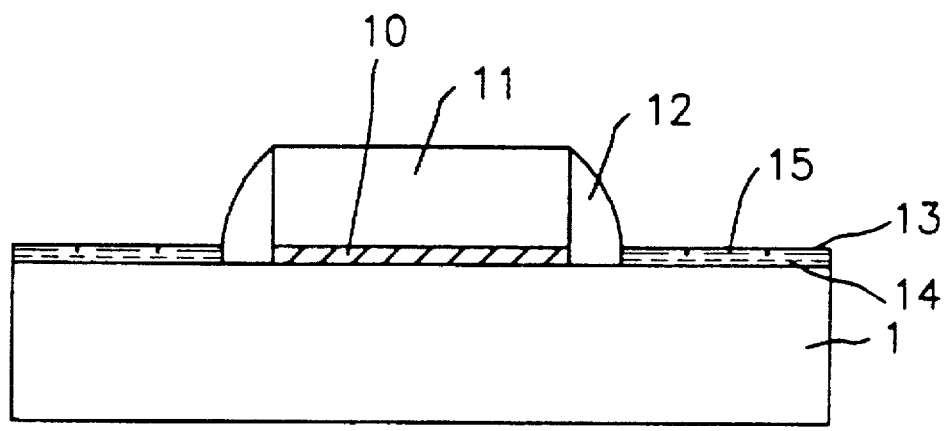

As shown in FIG. 1C, in order to form a thin silicide layer without consumption of the silicon substrate 1, tungsten ions 15 must be implanted into the amorphous silicon layer 13 with a smaller energy than that of the boron ions 14. Of course, ions of transition metal, such as titanium or cobalt, can be substituted for the tungsten ions 15. Particularly, it is necessary to control the energy for the tungsten ions 15 so as not to be implanted into the silicon substrate 1. In the preferred embodiment, the projected range of the tungsten ions 15 is set at half the thickness of the amorphous silicon layer 13.

Figure 1D:
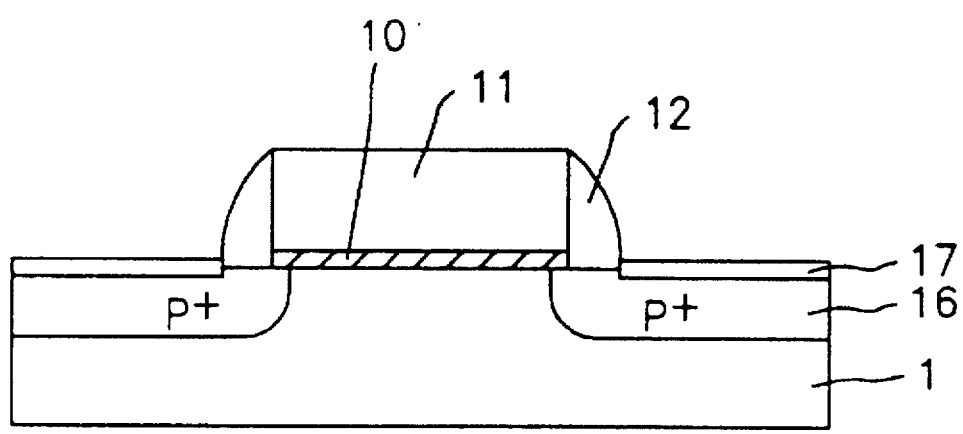

Finally, after implanting the boron and tungsten ions 15 into the amorphous silicon layer 13, as shown in FIG. 1D, the wafer is treated with a rapid thermal process such that the tungsten and boron ions 14 and 15 in the amorphous silicon layer 13 diffuse toward the silicon substrate 1. Since the diffusion coefficient of the boron ions 14 is higher than that of the tungsten ions 15, the source/drain regions 16 are formed in the silicon substrate 1, and the tungsten silicide layers 17 are formed on the source/drain regions 16.

As apparent from the above description, the present invention provides a superior effect capable of improving the speed of the devices by forming the shallow junction having a low sheet resistance.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a shallow junction of a low resistance on a silicon substrate, comprising the steps of:

forming an amorphous silicon layer on said silicon substrate;

implanting impurity ions and transition metal ions into said amorphous silicon layer, wherein implanting energy of transition metal ions is lower than that of said impurity ions; and applying a rapid thermal process to said amorphous silicon layer and said silicon substrate, to simultaneously diffuse said impurity ions and said transition metal ions into said silicon substrate, whereby said transition metal ions are diffused into said silicon substrate and then a silicide layer is formed on a surface of said silicon substrate, and said impurity ions are diffused into said silicon substrate and then a shallow junction is formed in said silicon substrate.

2. A method in accordance with claim 1, wherein said impurity ions are $BF_2$ ions.

3. A method in accordance with claim 1, wherein the projected range of said impurity ions is set at half the thickness of said amorphous silicon layer.

4. A method in accordance with claim 1, wherein said transition metal is one of tungsten, titanium or cobalt.

* * * * *